| (12) United States Patent | (10) Patent No.: US 10,957,354 B2 |
|---|---|
| Ino | (45) Date of Patent: Mar. 23, 2021 |

(54) BASE PLATE AND HARD DISK DRIVE

(71) Applicant: Nidec Corporation, Kyoto (JP)

(72) Inventor: Yasutaka Ino, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/671,209

(22) Filed: Nov. 1, 2019

(65) Prior Publication Data

US 2020/0185003 A1 Jun. 11, 2020

(30) Foreign Application Priority Data

Dec. 11, 2018 (JP) .............................. JP2018-231498

(51) Int. Cl.
| G11B 33/12 | (2006.01) |
| G11B 19/20 | (2006.01) |
| G11B 33/14 | (2006.01) |
| G11B 23/03 | (2006.01) |
| H05K 5/02 | (2006.01) |

(52) U.S. Cl.
CPC ...... *G11B 19/2018* (2013.01); *G11B 23/0316* (2013.01); *G11B 33/121* (2013.01); *G11B 33/148* (2013.01); *H05K 5/0217* (2013.01)

(58) Field of Classification Search
CPC .............................. G11B 33/12; G11B 33/121
USPC ...................................................... 360/99.16
See application file for complete search history.

(56) References Cited

U.S. PATENT DOCUMENTS

| 6,081,406 A * | 6/2000 | Morris .................... G11B 33/08 360/97.19 |
| 6,373,654 B1 * | 4/2002 | Iwahara ............. G11B 5/59633 360/97.19 |
| 8,842,386 B1 * | 9/2014 | Hirasawa ........... G11B 19/2018 360/99.16 |
| 2005/0174698 A1 * | 8/2005 | Matsuda ............ G11B 19/2009 360/264.7 |
| 2008/0007866 A1 | 1/2008 | Hayakawa et al. |
| 2014/0026397 A1 * | 1/2014 | Fujinawa ................ H02K 15/02 29/598 |
| 2015/0062749 A1 * | 3/2015 | Sugiki .................. F04D 29/0513 360/97.13 |
| 2019/0166705 A1 * | 5/2019 | Kato ..................... H05K 5/0052 |

* cited by examiner

*Primary Examiner* — Jefferson A Evans

(74) *Attorney, Agent, or Firm* — Keating & Bennett

(57) ABSTRACT

A base plate is a portion of a housing of a hard disk drive, and includes a cast base body. The base body includes an inner surface including an inside machined surface that is machined and an inside non-machined surface that is not machined. The base body includes an outer surface including an outside machined surface that is machined and an outside non-machined surface that is not machined. The outside machined surface and the inside non-machined surface overlap in an axial direction that is a direction parallel or substantially parallel to a rotation axis of a disk of the hard disk drive.

15 Claims, 6 Drawing Sheets

BASE PLATE AND HARD DISK DRIVE

CROSS REFERENCE TO RELATED APPLICATION

The present application claims priority under 35 U.S.C. § 119 to Japanese Application No. 2018-231498 filed on Dec. 11, 2018, the entire contents of which are hereby incorporated herein by reference.

1. FIELD OF THE INVENTION

The present disclosure relates to a base plate and a hard disk drive.

2. BACKGROUND

The hard disk drive has a motor that rotates a magnetic disk and a base plate that supports the motor. The hard disk drive writes and reads information while rotating the disk at high speed, and moving the head inside the housing that is formed by a base plate and a cover.

When the hard disk drive is driven, a viscous resistance is generated between the disk and head operating at high speed and the air present in the housing. This viscous resistance is a factor that increases noise and power consumption when the hard disk drive is driven. For this reason, in recent years, the housing of a hard disk drive may be filled with a low density gas such as helium. When the low density gas is used, the viscous resistance can be reduced. However, the low density gas tends to pass through even a slight gap. For this reason, when using a low density gas, higher airtightness is required for the housing of the hard disk drive.

The base plate is often produced by casting a metal such as aluminum. The surface of the cast product has a so-called "chill layer" having a higher density than other portions. This chill layer can suppress leakage of the low density gas through the base plate. However, the surface of the base plate of the cast product is partially machined after casting in order to obtain high dimensional accuracy. This machining may remove the chill layer.

SUMMARY

An example embodiment of the present disclosure is a base plate that is a portion of a housing of a hard disk drive, and includes a cast base body. The base body includes an inner surface including an inside machined surface that is machined and an inside non-machined surface that is not machined. The base body includes an outer surface including an outside machined surface that is machined and an outside non-machined surface that is not machined. The outside machined surface and the inside non-machined surface overlap in an axial direction that is a direction parallel or substantially parallel to a rotation axis of a disk of the hard disk drive.

The above and other elements, features, steps, characteristics and advantages of the present disclosure will become more apparent from the following detailed description of the example embodiments with reference to the attached drawings.

DETAILED DESCRIPTION

Hereinafter, example embodiments of the present disclosure will be described with reference to the drawings. In the present disclosure, the direction parallel to the rotation axis of a disk, the direction perpendicular to the rotation axis of the disk, and the direction along a circular arc with the rotation axis of the disk as the center thereof are referred to as the "axial direction", the "radial direction", and the "circumferential direction", respectively. It is also assumed herein that the axial direction is a vertical direction, and that a side on which a cover is disposed with respect to a base plate is an upper side, and the shape of each member or portion and relative positions of different members or portions will be described based on the above assumptions. However, the definition of the vertical direction is not intended to limit the orientation when the base plate and the hard disk drive according to the present disclosure are used.

Figure 1:
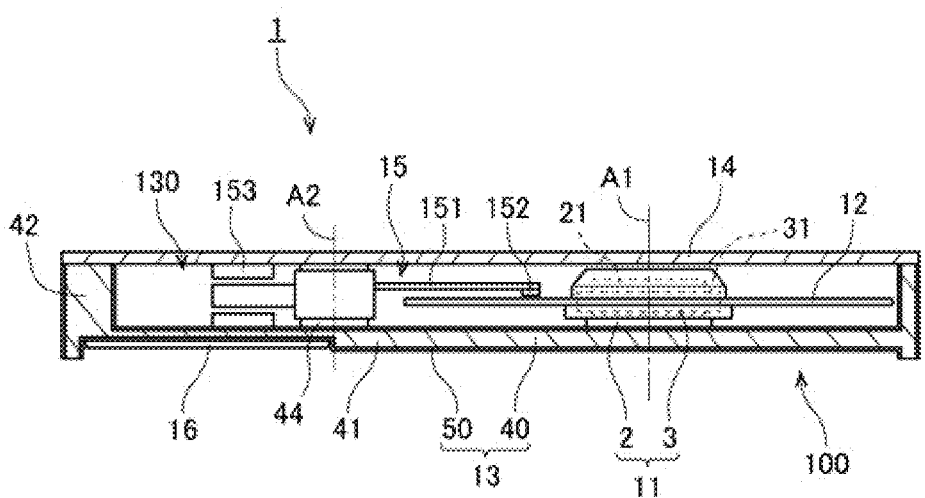
FIG. 1 is a vertical cross-sectional view of a hard disk drive according to a first example embodiment of the present disclosure.

FIG. 1 is a vertical cross-sectional view of a hard disk drive 1 according to a first example embodiment of the present disclosure.

This hard disk drive 1, while rotating a disk-shaped disk 12 having a circular hole in the center, is an apparatus for writing information to the disk 12 and reading information from the disk 12. As shown in FIG. 1, the hard disk drive 1 includes a motor 11, the disk 12, a base plate 13, a cover 14, an access unit 15, and a circuit board 16.

The motor 11 is a device that rotates the disk 12 about a rotation axis A1 while supporting the disk 12. The motor 11 has a stationary unit 2 and a rotating unit 3. The stationary unit 2 is fixed to the base plate 13. The rotating unit 3 is supported so as to be rotatable relative to the stationary unit 2. The stationary unit 2 includes a stator 21 that is an armature. The stator 21 has a plurality of coils. The rotating unit 3 includes a rotor magnet 31. When a drive current is supplied to the coil of the stator 21, a rotation magnetic field is generated between the stator 21 and the rotor magnet 31. As a result, the rotating unit 3 rotates with respect to the stationary unit 2 around the rotation axis A1.

The disk 12 is a magnetic disk capable of magnetically storing information. The disk 12 is fixed to the rotating unit 3 of the motor 11. When the motor 11 is driven, the disk 12 as well as the rotating unit 3 rotates about the rotation axis A1. The hard disk drive 1 of the present example embodiment has one disk 12. However, the hard disk drive 1 may have two or more disks 12.

The base plate 13 is a substantially plate-like member that supports the motor 11 and the access unit 15. The base plate includes a base body 40 that is a cast product, and an electrodeposition coating film 50 that covers the surface of the base body 40. The base body 40 is obtained by pouring molten metal into a mold and hardening the molten metal. For example, aluminum or an aluminum alloy is used as the metal that is the material of the base body 40. The electrodeposition coating film 50 is, for example, an epoxy resin insulating film.

Figure 2:
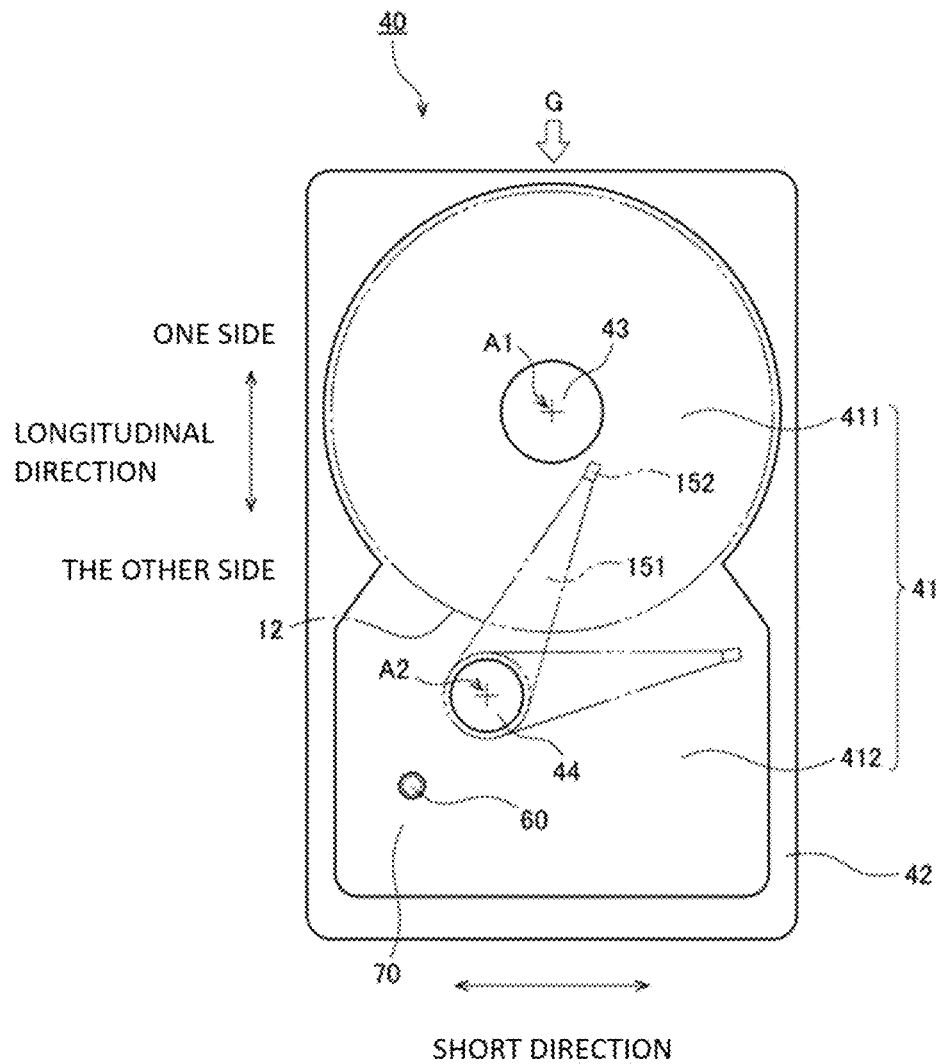
FIG. 2 is a view of the upper surface of the base plate.
Figure 3:
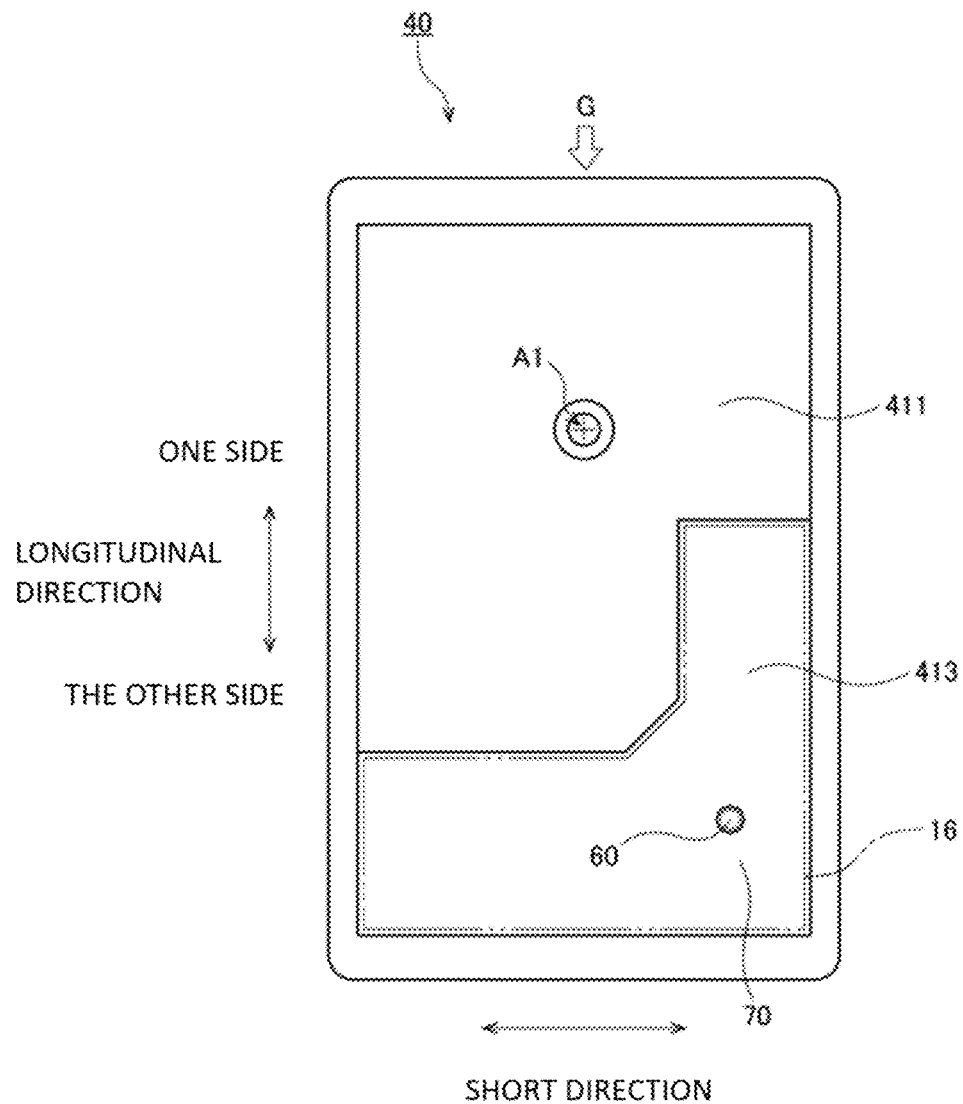
FIG. 3 is a view of the lower surface of the base plate.

FIG. 2 is a view of the upper surface of the base plate 13. FIG. 3 is a view of the lower surface of the base plate 13. As shown in FIGS. 1 to 3, the base plate 13 includes a bottom plate portion 41, a side wall portion 42, a stator support portion 43, and a pivot post 44. The bottom plate portion 41 extends perpendicular to the rotation axis A1 below the motor 11, the disk 12, and the access unit 15. The shape of the bottom plate portion 41 in a top view is a rectangular shape having a long side and a short side. The side wall portion 42 is a rectangular and cylindrical portion that extends upward from the contour portion of the bottom plate portion 41. An opening 130 opened upward is formed in the upper part of the base plate 13.

Hereinafter, the direction along the long side of the base plate 13 is referred to as a "longitudinal direction", and the direction along the short side of the base plate 13 is referred to as a "short direction". As shown in FIG. 2, the upper surface of the bottom plate portion 41 includes a circular first region 411 located on one side in the longitudinal direction, and a rectangular second region 412 located on the other side in the longitudinal direction. The motor 11 and the disk 12 are disposed in the first region 411. The stator support portion 43 protrudes upward from the center of the first region 411. The stator 21 of the motor 11 is fixed to the stator support portion 43. A swing mechanism 153 of the access unit 15 described later is disposed in the second region 412. The pivot post 44 protrudes upward from the second region 412.

As shown in FIG. 3, the lower surface of the bottom plate portion 41 has a board placement region 413. The board placement region 413 is located on the other side in the longitudinal direction relative to the rotation axis A1 of the motor 11. The board placement region 413 is recessed upward relative to the other region of the lower surface of the bottom plate portion 41. As indicated by a two-dot chain line in FIG. 3, the circuit board 16 is disposed in the board placement region 413. The board placement region 413 of the present example embodiment extends in a substantially L shape along the other edge in the longitudinal direction and the one edge in the short direction. However, the shape of the board placement region 413 may be another shape.

The cover 14 is supported on the upper end face of the side wall portion 42 of the base plate 13. The opening 130 at the top of the base plate 13 is closed by the cover 14. The base plate 13 and the cover 14 are fixed with screws, for example. Further, the joint between the base plate 13 and the cover 14 is sealed with a sealing member such as a gasket. The motor 11, the disk 12, and the access unit 15 are accommodated in a housing 100 formed by the base plate 13 and the cover 14.

Note that the housing 100 is filled with any of helium, hydrogen, or a gas mixture of helium and hydrogen, or a gas mixture of any one of the above gases and an air. These gases have a lower density than the air outside the housing 100. In this way, in a case where the housing 100 is filled with a gas having a lower density than air, when driving the hard disk drive 1, the viscous resistance applied to the disk 12 and the access unit 15 is reduced.

The access unit 15 includes an arm 151, a head 152 provided at the tip of the arm 151, and the swing mechanism 153. The arm 151 is attached to the pivot post 44 of the base plate 13 via a bearing. The swing mechanism 153 is a mechanism for swinging the arm 151 and the head 152. When the swing mechanism 153 is driven, the arm 151 swings about a swing axis A2 extending in the axial direction. As a result, the head 152 moves along a recording surface of the disk 12. The head 152 faces the upper surface or the lower surface of the disk 12, and writes information to the disk 12 and reads information from the disk 12. The head 152 may perform only one of writing of information to the disk 12 and reading of information from the disk 12.

The circuit board 16 is fixed to the above-described board placement region 413 on the lower surface of the bottom plate portion 41. As the circuit board 16, for example, a so-called rigid board with small flexibility is used. An electric circuit necessary for driving the hard disk drive 1 is mounted on the circuit board 16. The electric circuit may be a circuit for operating the motor 11, may be a circuit for operating the swing mechanism 153, or may be a circuit for detecting various signals. A plurality of electronic components constituting the electric circuit is mounted on the surface of the circuit board 16.

Figure 4:
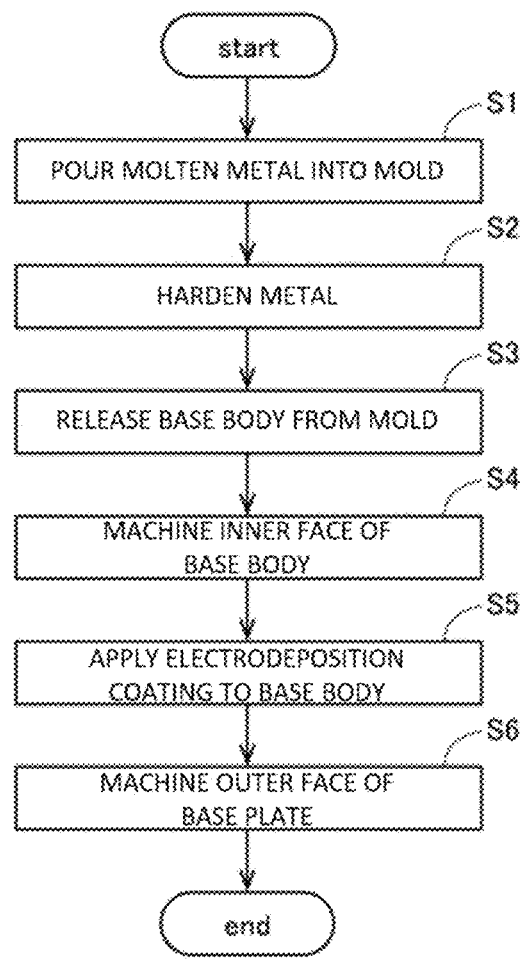
FIG. 4 is a flowchart showing a manufacturing procedure of the base plate.

Next, a method for manufacturing the base plate 13 described above will be described. FIG. 4 is a flowchart showing a procedure of manufacturing the base plate 13.

When manufacturing the base plate 13, first, the manufacturer combines a pair of molds, so that a cavity corresponding to the shape of the base plate 13 is formed inside the mold. Next, the manufacturer pours molten metal into the cavity in the mold (step S1). The molten metal is poured from, for example, a gate provided at an end of the mold in the longitudinal direction on the disk side (for example, the position of the white arrow G in FIGS. 2 and 3). For example, heat-melted aluminum or an aluminum alloy is used as the molten metal. In step S1, the temperature of the mold before pouring the molten metal is lower than the temperature of the molten metal.

When the molten metal is distributed to the cavity in the mold, the manufacturer subsequently hardens the molten metal by cooling (step S2). As a result, the base body 40 is formed. Thereafter, the manufacturer opens the pair of molds and releases the base body 40 from the molds (step S3).

Subsequently, the manufacturer machines the inner surface of the base body 40 (step S4). In particular, the manufacturer machines the necessary part of the surface corresponding to the upper surface of the bottom plate portion 41 of the base body 40, and the surface corresponding to the inside surface of the side wall portion 42. By this machining, the dimensional accuracy of the machined surface can be improved. As a result, in the later assembly process, the motor 11 and the access unit 15 can be assembled with high accuracy for the base plate 13. Further, it is possible to suppress the contact of the disk 12 and the access unit 15 to the inner surface of the base plate 13.

Subsequently, the manufacturer applies electrodeposition coating on the surface of the base body 40 (step S5). In particular, the base body 40 in a liquid containing an epoxy resin coating material is immersed, and a coating material is adhered to the surface of the base body 40 by applying a voltage between the coating material and the base body 40. As a result, the electrodeposition coating film 50 is formed on the surface of the base body 40.

Thereafter, the manufacturer machines the outer surface of the base body 40 (step S6). Specifically, the manufacturer machines a necessary portion of the face corresponding to the lower surface of the bottom plate portion 41 of the base body 40. In this step S6, part of the electrodeposition coating film 50 formed in step S5 and part of the surface of the base body 40 are machined. Therefore, the electrodeposition coating film 50 in the machined portion is removed, and the metal of the base body 40 is exposed.

By this machining, the dimensional accuracy of the machined surface can be improved. When the circuit board 16 is disposed in a later process, the circuit board 16 is brought into contact with the machined surface formed in step S6. As a result, the circuit board 16 can be accurately disposed with respect to the base plate 13.

Figure 5:
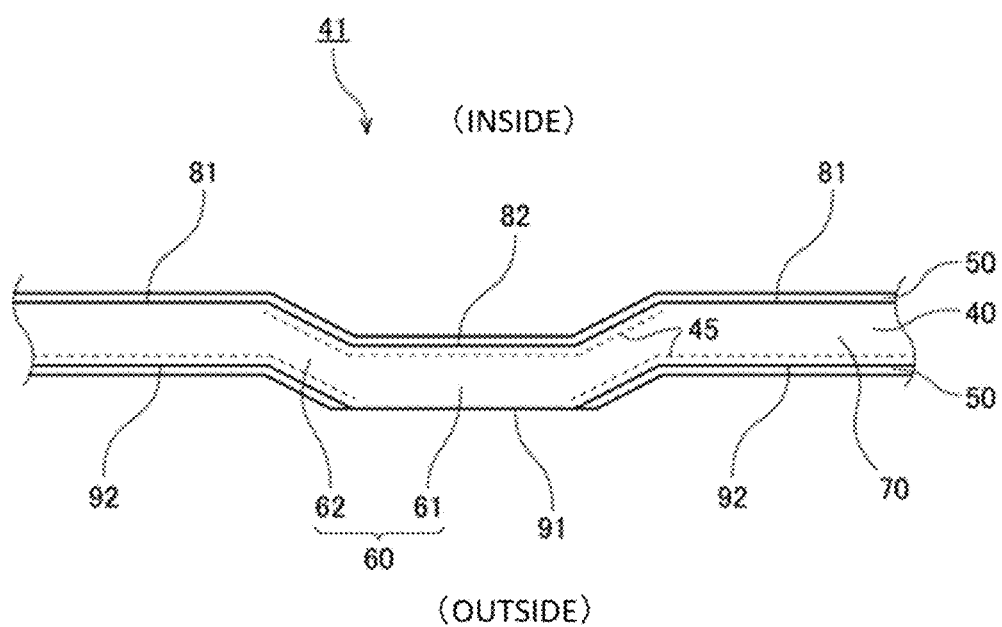
FIG. 5 is a partial vertical sectional view of the bottom plate portion in the vicinity of the convex portion.

As shown in FIGS. 2 and 3, the bottom plate portion 41 of the base plate 13 has a convex portion 60 and a flat portion 70. FIG. 5 is a partial longitudinal sectional view of the bottom plate portion 41 in the vicinity of the convex portion 60. The upper surface of the bottom plate portion 41 in FIG. 5 is part of the inner surface of the base plate 13. The lower surface of the bottom plate portion 41 in FIG. 5 is part of the outer surface of the base plate 13. The convex portion 60 protrudes below the bottom plate portion 41, that is, toward the outside of the housing 100. The upper surface of the convex portion 60 is a concave surface that is recessed downward from the upper surface of the bottom plate portion 41. The lower surface of the convex portion is a convex surface that protrudes downward from the lower surface of the bottom plate portion 41. The flat portion 70 is located around the convex portion 60 and extends perpendicular to the rotation axis A1.

As shown in FIG. 5, the convex portion 60 of the present example embodiment has an apex portion 61 and an inclined portion 62. The apex portion 61 is located below the flat portion 70 and extends perpendicular to the rotation axis A1. The inclined portion 62 is an annular portion that connects the apex portion 61 and the flat portion 70. The inclined portion 62 extends in an inclination direction inclined with respect to the axial direction (the thickness direction of the bottom plate portion 41).

The upper surface of the bottom plate portion 41 has an inside machined surface 81 and an inside non-machined surface 82. The inside machined surface 81 is a face machined in step S4 described above. The inside non-machined surface 82 is a face that is not machined in step S4 described above. However, the inside machined surface 81 and the inside non-machined surface 82 are both covered with the electrodeposition coating film 50. More specifically, the inside machined surface 81 includes the upper surface of the flat portion 70. The inside non-machined surface 82 includes a concave surface inside the convex portion 60.

Further, the lower surface of the bottom plate portion 41 has an outside machined surface 91 and an outside non-machined surface 92. The outside machined surface 91 is a face machined in step S6 described above. The outside machined surface 91 is not covered with the electrodeposition coating film 50. The outside non-machined surface 92 is a face that is not machined in step S6 described above. The outside non-machined surface 92 is covered with the electrodeposition coating film 50. Specifically, the outside machined surface 91 includes the lower surface of the apex portion 61. The outside non-machined surface 92 includes the lower surface of the flat portion 70 and the lower surface of the inclined portion 62.

When casting the base body 40, in steps S1 to S2 described above, the portion, of the molten metal, in contact with the mold is cooled and hardened faster than the portion, of the molten metal, away from the mold. As a result, the base body 40 after casting has a surface layer whose density is higher than that of the inside. This high-density layer is called a chill layer 45. Since the chill layer 45 has a high metal density, it is difficult for a low density gas such as helium to pass therethrough. As a result, it is possible to suppress leakage of low density gas such as helium from the inside of the housing 100 of the hard disk drive 1 to the outside. However, in the machined surfaces 81 and 91 machined in step S4 and step S6 described above, the chill layer 45 on the surface of the base body 40 may be removed. For this reason, when the inside machined surface 81 and the outside machined surface 91 of the base body 40 are close to each other, there is a possibility that low density gas leaks to the outside through these machined surfaces 81 and 91.

However, as shown in FIG. 5, in the bottom plate portion 41 of the present example embodiment, the outside machined surface 91 and the inside non-machined surface 82 overlap in the axial direction. Further, the inside machined surface 81 and the outside non-machined surface 92 overlap in the axial direction. Further, the inside non-machined surface 82 and the outside non-machined surface 92 overlap in the axial direction. For this reason, the inside machined surface 81 and the outside machined surface 91 do not overlap in the axial direction. That is, the inside machined surface 81 and the outside machined surface 91 are not close to each other. Therefore, even when the chill layer 45 of the base body 40 is removed by the machining in step S4 and step S6 described above, it is possible to suppress leakage of low density gas such as helium to the outside of the housing 100 from inside the housing 100 through the inside machined surface 81 and the outside machined surface 91. As a result, the airtightness of the housing 100 can be improved.

In particular, in recent years, in order to reduce the thickness of the hard disk drive 1, it is required to reduce the thickness of the bottom plate portion 41 of the base plate 13. For this reason, the thickness of the convex portion 60 in the axial direction (for example, the thickness of the apex portion 61 in the axial direction) may be 1.5 mm or less. In this case, when the inside machined surface 81 and the outside machined surface 91 are close to each other, leakage of the low density gas is particularly likely to occur. However, in the structure of the present example embodiment, the inside machined surface 81 and the outside machined surface 91 do not overlap in the axial direction as described above. As a result, the leakage of low density gas can be suppressed. That is, it is possible to handle two technical difficulties of reducing the thickness of the hard disk drive 1 and suppressing leakage of low density gas, which are difficult to solve at the same time.

Subsequently, the base plate 13 according to the second example embodiment will be described focusing on differences from the first example embodiment.

Figure 6:
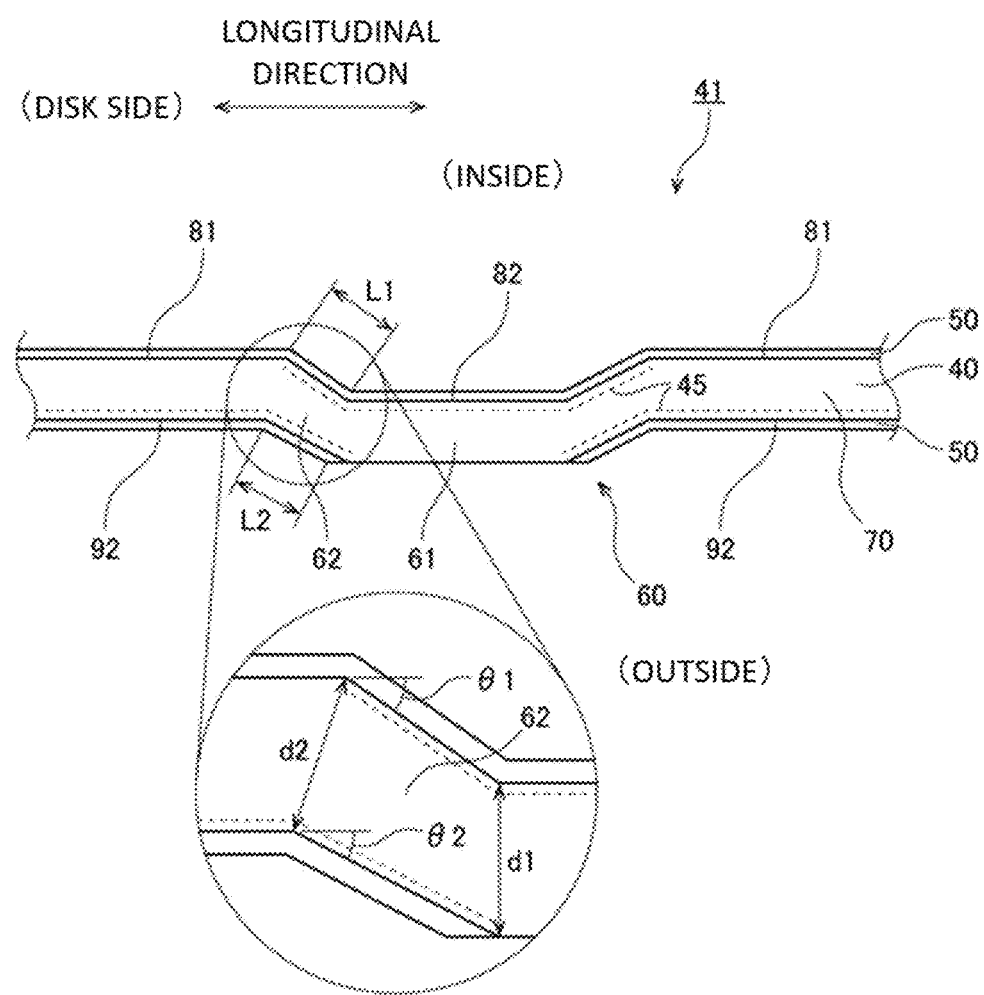
FIG. 6 is a partial longitudinal sectional view of the vicinity of the convex portion of the base plate according to a second example embodiment of the present disclosure.

FIG. 6 is a partial longitudinal sectional view of the vicinity of the convex portion 60 of the bottom plate portion 41 of the base plate 13 according to the second example embodiment. The left side in FIG. 6 is closer to the disk 12 than the right side in FIG. 6. That is, the disk 12 of the hard disk drive 1 is disposed on the left side of FIG. 6.

As already mentioned, when casting the base body 40, the molten metal is poured from, for example, a gate provided at an end of the mold in the longitudinal direction on the disk 12 side (for example, the position of the white arrow G in FIGS. 2 and 3). Accordingly, the molten metal flows from the left side to the right side in FIG. 6 in the cavity in the mold.

In the example of FIG. 6, the thickness of the inclined portion 62 gradually increases toward the disk 12 side relative to the apex portion 61 of the convex portion 60 with increasing distance from the apex portion 61. Further, the relationship L1<L2 is established where L1 is the length of the inside surface of the inclined portion 62 in the inclination direction, and L2 is the length of the outside surface of the inclined portion 62 in the inclination direction on the disk 12 side relative to the apex portion 61.

In addition, as shown in FIG. 6, the relationship d1<d2 is established where, on the disk 12 side relative to the apex portion 61, d1 is the distance between the end of the inside surface of the inclined portion 62 on the apex portion 61 side and the end of the outside surface of the inclined portion 62 on the apex portion 61 side, and d2 is the distance between the end of the inside surface of the inclined portion 62 on the disk 12 side and the end of the outside surface of the inclined portion 62 on the disk 12 side.

In addition, as shown in FIG. 6, the relationship θ1>θ2 is established where θ1 is the inclination angle of the inside surface of the inclined portion 62 with respect to the surface of the flat portion 70 and θ2 is the inclination angle of the outside surface of the inclined portion 62 with respect to the surface of the flat portion 70 on the disk 12 side relative to the apex portion 61. The angle θ1 is preferably set to 30° to 45°, for example. Further, the angle θ2 is preferably 10° to 20°, for example.

With this shape, when casting the base body 40, the molten resin flowing from the disk 12 side can be efficiently distributed to the convex portion 60. Therefore, the convex portion 60 can be cast with high accuracy. As a result, leakage of low density gas in the vicinity of the convex portion 60 can be further suppressed.

In particular, in recent years, in order to reduce the thickness of the hard disk drive 1, it is required to reduce the thickness of the bottom plate portion 41 of the base plate 13. For this reason, the thickness of the convex portion 60 in the axial direction (for example, the thickness of the apex portion 61 in the axial direction) may be 1.5 mm or less. In this case, when the base plate 13 is cast, it is particularly difficult to satisfactorily distribute the molten resin to the convex portion 60 of the bottom plate portion 41. In this case, leakage of low density gas is likely to occur in particular. However, in the structure of the present example embodiment, as described above, it is possible to satisfactorily distribute the molten resin to the convex portion 60 by devising the shape of the inclined portion 62. As a result, it is possible to suppress leakage of low density gas via the convex portion 60. That is, it is possible to solve two technical difficulties of reducing the thickness of the hard disk drive 1 and suppressing leakage of low density gas.

An example embodiment of the present disclosure is described above. However, the present disclosure is not limited to the above example embodiment.

In the above example embodiment, the base plate 13 is provided with one convex portion 60. However, the number of convex portions 60 provided on the base plate 13 may be two or more.

Further, in the above example embodiment, the convex portion 60 is provided in a board placement region 413 of the base plate 13. However, the convex portion 60 may be provided at another position of the base plate 13.

The detailed shape of each component may differ from the shape illustrated in the drawings of the present disclosure. In addition, the elements that appear in the above-described example embodiments and the modifications may also be appropriately combined in a range in which there is no contradiction.

The present disclosure can be used for, for example, a base plate and a hard disk drive.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A base plate that is a portion of a housing of a hard disk drive, the base plate comprising:
   a cast base body; wherein
   the base body includes an inner surface including an inside machined surface that is machined and an inside non-machined surface that is not machined;
   the base body includes an outer surface including an outside machined surface that is machined and an outside non-machined surface that is not machined;
   the outside machined surface and the inside non-machined surface overlap in an axial direction that is a direction parallel or substantially parallel to a rotation axis of a disk of the hard disk drive;
   the base body includes a convex portion protruding outward;
   the outside machined surface includes a lower surface of an apex portion of the convex portion; and
   the inside non-machined surface includes a concave surface inside the convex portion.

2. The base plate according to claim 1, wherein the inside machined surface and the outside non-machined surface overlap in the axial direction.

3. The base plate according to claim 1, wherein
   the base body includes a flat portion located around the convex portion;
   the inside machined surface includes an upper surface of the flat portion; and
   the outside non-machined surface includes a lower surface of the flat portion.

4. The base plate according to claim 3, wherein the convex portion includes:
   an inclined portion that connects the apex portion and the flat portion and that extends in an inclination direction inclined with respect to the axial direction;
   L1<L2 is satisfied; where
   on a disk side relative to the apex portion:
   L1 is a length of an inside surface of the inclined portion in the inclination direction; and
   L2 is a length of an outside surface of the inclined portion of the inclination direction.

5. The base plate according to claim 4, wherein
   d1<d2 is satisfied; where
   on the disk side relative to the apex portion:
   d1 is a distance between an end of the inside surface of the inclined portion on the apex portion side and an end of the outside surface of the inclined portion on the apex portion side; and
   d2 is a distance between an end of the inside surface of the inclined portion on the disk side and an end of the outside surface of the inclined portion on the disk side.

6. The base plate according to claim 4, wherein
   θ1>θ2 is satisfied; where
   on the disk side relative to the apex portion:
   θ1 is an inclination angle of the inside surface of the inclined portion with respect to a surface of the flat portion and
   θ2 is an inclination angle of the outside surface of the inclined portion with respect to a surface of the flat portion.

7. The base plate according to claim 6, wherein
the θ1 is about 30° to about 45°; and
the θ2 is about 10° to about 20°.

8. The base plate according to claim 1, wherein the convex portion has a thickness of about 1.5 mm or less.

9. The base plate according to claim 1, further comprising:
an electrodeposition coating film covering at least a portion of a surface of the base body; wherein
the inside machined surface is covered with the electrodeposition coating film; and
the outside machined surface is exposed from the electrodeposition coating film.

10. A hard disk drive comprising:
the base plate according to claim 1;
a cover that defines the housing together with the base plate;
a motor supported by the base plate; and
a disk that is rotated inside the housing by the motor.

11. The hard disk drive according to claim 10, wherein the housing is filled with a gas having a lower density than air.

12. A base plate that is a portion of a housing of a hard disk drive, the base plate comprising:
a cast base body; and
an electrodeposition coating film covering at least a portion of a surface of the base body; wherein
the base body includes an inner surface including an inside machined surface that is machined and an inside non-machined surface that is not machined;
the base body includes an outer surface including an outside machined surface that is machined and an outside non-machined surface that is not machined;
the outside machined surface and the inside non-machined surface overlap in an axial direction that is a direction parallel or substantially parallel to a rotation axis of a disk of the hard disk drive;
the inside machined surface is covered with the electrodeposition coating film; and
the outside machined surface is exposed from the electrodeposition coating film.

13. The base plate according to claim 12, wherein the inside machined face and the outside non-machined face overlap in the axial direction.

14. A hard disk drive comprising:
the base plate according to claim 12;
a cover that forms the housing together with the base plate;
a motor supported by the base plate; and
a disk that is rotated inside the housing by the motor.

15. The hard disk drive according to claim 14, wherein the housing is filled with a gas having a lower density than air.

* * * * *